United States Patent
Zhang et al.

(10) Patent No.: US 8,836,448 B2
(45) Date of Patent: Sep. 16, 2014

(54) MAGNETIC INTERFACE CIRCUIT

(75) Inventors: Jie Zhang, Kunshan (CN); Yueh-Shan Shih, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 543 days.

(21) Appl. No.: 13/157,375

(22) Filed: Jun. 10, 2011

(65) Prior Publication Data

US 2011/0304411 A1    Dec. 15, 2011

(30) Foreign Application Priority Data

Jun. 10, 2010   (CN) .......................... 2010 2 0221869

(51) Int. Cl.
*H03H 7/09*    (2006.01)
*H01R 12/50*   (2011.01)

(52) U.S. Cl.
CPC ............... *H03H 7/09* (2013.01); *H01R 23/688* (2013.01)
USPC ........................ 333/177; 333/181; 439/607.01

(58) Field of Classification Search
CPC ................................ H03H 7/09; H01R 23/688
USPC ............... 333/12, 177, 181; 439/607.01, 676, 439/620.01, 620.15
See application file for complete search history.

(56) References Cited

U.S. PATENT DOCUMENTS

| | | |
|---|---|---|
| 7,123,117 B2 | 10/2006 | Chen et al. |
| 2006/0121801 A1* | 6/2006 | Pischl .......................... 439/894 |
| 2007/0015416 A1* | 1/2007 | Gutierrez et al. ............. 439/676 |
| 2010/0022133 A1 | 1/2010 | Chow et al. |

* cited by examiner

*Primary Examiner* — Benny Lee
*Assistant Examiner* — Rakesh Patel
(74) *Attorney, Agent, or Firm* — Ming Chieh Chang; Wei Te Chung

(57) ABSTRACT

A noise filtering magnetic interface circuit used for an electrical connector is provided. The magnetic interface circuit includes a number of signal channels and a capacitor (40). Each channel has a transformer (10) and a 3-wire common mode choke (20). The transformer has a first winding (100) connected and a second winding (110), the first winding having two opposite outputs, the second winding having two outputs and a center tap (111). The 3-wire common mode choke has a center winding (220) and two outer windings (210, 230), the center winding having a first output connected to the center tap of the second winding and a second output opposite to the first output, the two outer windings being respectively connected to the two outputs of the second winding. The capacitor has a first pole connected to the second outputs of the center windings of the channels and an opposite second pole connected to a ground.

5 Claims, 1 Drawing Sheet

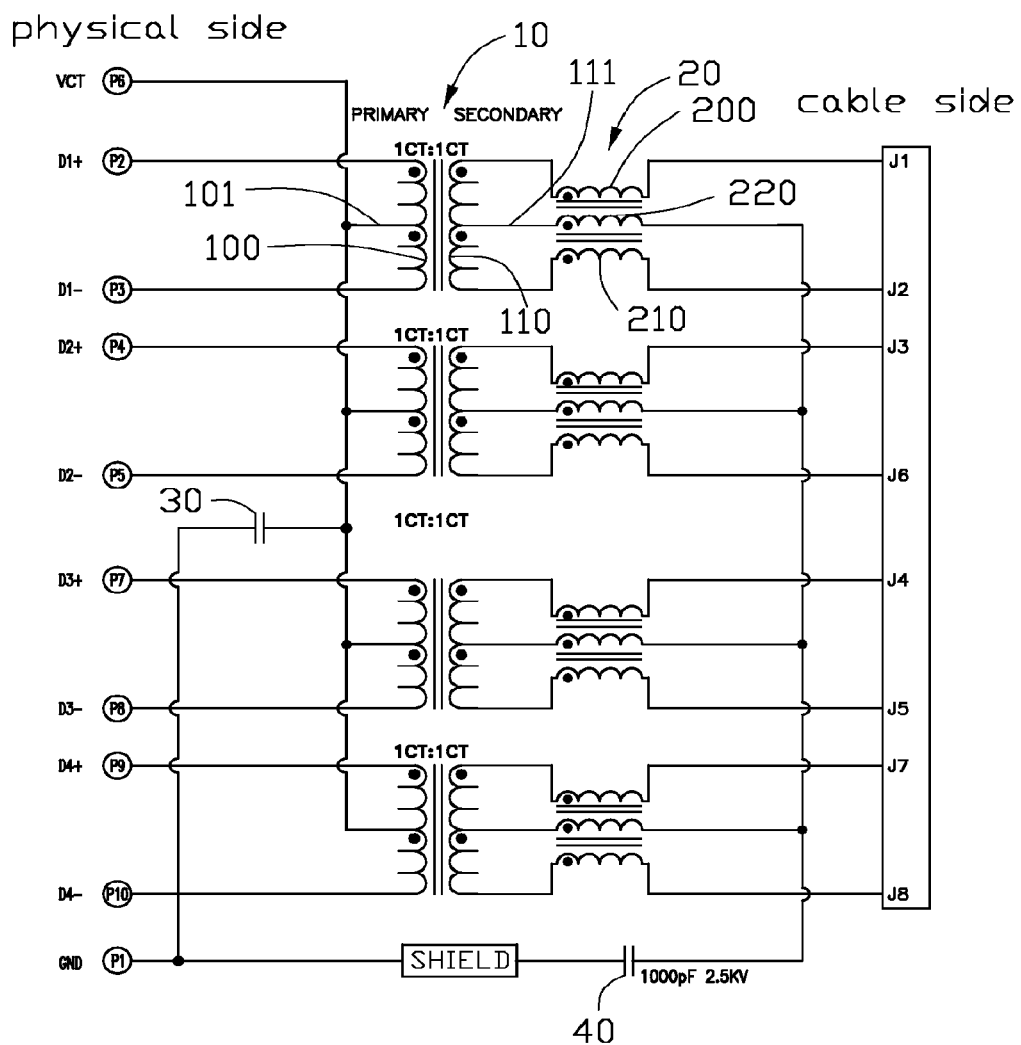

US 8,836,448 B2

MAGNETIC INTERFACE CIRCUIT

BACKGROUND OF THE INVENTION

1. Field of the Invention

The present invention relates to a magnetic interface circuit, and particularly, to noise filtering magnetic interface circuit used in an electrical connector.

2. Description of Related Art

U.S. Pat. No. 7,123,117 issued to Chen et al. discloses a magnetic interface circuit for a LAN, such as an Ethernet network, including a transformer and a 3-wire common mode choke. The transformer has a first winding connected to the line side of the LAN and a second winding connected to the circuit side of the LAN. Each of the first and second windings has two output ports and one of the windings has a center tap port. The 3-wire common mode choke has a center winding and two outer windings. The center winding of the 3-wire common mode choke is connected to the center tap of the one winding and the outer windings of the 3-wire common mode choke are respectively connected to the output ports of the one winding. The common mode signals from the center taps are connected with a resister and a ground. U.S. patent publication No. 20100022133, published on Jan. 28, 2010, discloses such a circuit scheme used in an electrical connector and including, among other things, a respective resistor directed connected to an associated channel transformer and a respective capacitor directly connected to an output of an associated 3-wire common mode choke center winding.

SUMMARY OF THE INVENTION

An object of the present invention is to provide a noise filtering magnetic interface circuit used for an electrical connector with low manufacturing cost. The magnetic interface circuit comprises a plurality of signal channels and a capacitor. Each channel has a transformer and a 3-wire common mode choke. The transformer has a first winding and a second winding, the first winding having two opposite outputs, the second winding having two outputs and a center tap. The 3-wire common mode choke has a center winding and two outer windings, the center winding having a first output connected to the center tap of the second winding and a second output opposite to the first out put, the two outer windings being respectively connected to the two outputs of the second winding. The capacitor has a first pole directly connected to the second outputs of the center windings of the plurality of channels and an opposite second pole connected to a ground.

Another object of the present invention is to provide a noise filtering magnetic interface circuit used for an electrical connector having a cable side and a physical side. The magnetic interface circuit comprises a plurality of signal channels connected between the cable side and the physical side, and a capacitor. Each channel has a transformer and a common mode choke. The transformer has a first winding and a second winding, the first winding having two outputs and a center tap, the second winding having two outputs. The common mode choke has a third winding and a fourth winding, the third winding having a first output connected to one output of the second winding and an opposite second output, the fourth winding having a first output connected to the other output of the second winding and an opposite second output. The capacitor has a first pole directly connected to the center taps of the first windings of the plurality of channels and an opposite second pole connected to a ground.

Other objects, advantages and novel features of the invention will become more apparent from the following detailed description of a preferred embodiment when taken in conjunction with the accompanying drawings.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 is circuit diagram according to an embodiment of the present invention.

DETAILED DESCRIPTION OF THE INVENTION

Reference will now be made to the drawing figures to describe the present invention in detail.

Referring to FIG. 1, a magnetic interface circuit used for an electrical connector having an outer shield, is shown. The electrical connector includes a plurality of contacts for mating with a cable end connector which forms a cable side and a plurality of terminals mounted onto a printed circuit board which forms a physical side.

The connector includes four signal channels, a first capacitor 40 and a second capacitors 30. Each channel has a transformer 10 and a 3-wire common mode choke 20.

The transformer 10 has a first winding 100 and a second winding 110 coupling to each other. The first winding 100 has two opposite outputs (not labeled) connected to the physical side and a center tap 101. The second winding 110 two opposite outputs (not labeled) and a center tap 111. The 3-wire common mode choke 20 has a center winding 220 and two outer windings 200, 210. The center winding 220 has a first output connected to the center tap 111 of the second winding 110 and a second output opposite to the first output. The two outer windings 200, 210 are respectively connected between two outputs of the second winding 110 and the cable side.

The first capacitor 40 has a first pole and an opposite second pole. The first pole of the first capacitor 40 is directly connected to the second outputs of the center windings 220 of the four channels. The second pole of the first capacitor 40 is serially connected to the outer shield and a ground of the physical side. The first capacitor 40 has a capacity of 1000 uf and a safe voltage of 2500V.

The second capacitor 30 has a first pole directly connected to the center taps 101 of the first windings 100, and an opposite second pole directly connected to the ground of the physical side.

It should be noted that the physical side and the cable side could be exchanged as needed and the first capacitor and the second capacitor could be exchanged accordingly. It is further noted that the connector has similar noise filtering function and lower manufacturing cost since four resisters are omitted in the magnetic interface circuit.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A magnetic interface circuit used for an electrical connector, comprising:

a plurality of signal channels, each signal channel having:

a transformer having a first winding and a second winding, the first winding having two opposite outputs, the second winding having two outputs and a center tap, and a 3-wire common mode choke having a center winding and two outer windings, the center winding having a first output being connected to the center tap of the second winding and a second output opposite to the first output, the two outer windings being respectively connected to the two outputs of the second winding;

a capacitor having a first pole directly connected to the second outputs of the center windings of the plurality of signal channels and an opposite second pole connected to a ground without involvement with a resistor; wherein the outputs of the first windings are connected to a physical side and the outer windings of the 3-wire common mode choke of each of the plurality of signal channels are connected to a cable side; and a second capacitor having a first pole and an opposite second pole, and wherein the first winding of each signal channel has a center tap, the first pole of the second capacitor being directly connected to the center tap of the first winding of each signal channel, the second pole of the second capacitor being directly connected to the ground.

2. The magnetic interface circuit according to claim 1, wherein the electrical connector has an outer shield and the second pole of the capacitor is serially connected to the outer shield and a ground of the physical side.

3. The magnetic interface circuit according to claim 1, wherein the capacitor has a capacity of 1000 uf.

4. The magnetic interface circuit according to claim 1, wherein the capacitor has a safe voltage of 2500V.

5. A magnetic interface circuit used for an electrical connector having a cable side and a physical side, comprising:

a plurality of signal channels connected between the cable side and the physical side, each signal channel having:

a transformer having a first winding and a second winding, the first winding having two outputs and a center tap, the second winding having two outputs and a center tap, and a common mode choke having a third winding and a fourth winding, the third winding having a first output connected to one output of the second winding and an opposite second output, the fourth winding having a first output connected to the other output of the second winding and an opposite second output;

a capacitor having a first pole directly connected to the center tap of the first windings of the plurality of signal channels and an opposite second pole directly connected to a ground; and wherein the outputs of the first winding are connected to the physical side, and wherein the opposite second outputs of the third and the fourth windings are connected to the cable side.

* * * * *